US009076756B2

(12) United States Patent
Sasaki et al.

(10) Patent No.: US 9,076,756 B2
(45) Date of Patent: Jul. 7, 2015

(54) SEMICONDUCTOR DEVICE, SEMICONDUCTOR DEVICE UNIT, ACTIVE MATRIX SUBSTRATE, LIQUID CRYSTAL PANEL, AND LIQUID CRYSTAL DISPLAY

(75) Inventors: Osamu Sasaki, Osaka (JP); Yuhichiroh Murakami, Osaka (JP); Yasushi Sasaki, Osaka (JP); Etsuo Yamamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 52 days.

(21) Appl. No.: 13/819,822

(22) PCT Filed: Aug. 26, 2011

(86) PCT No.: PCT/JP2011/069346
§ 371 (c)(1),
(2), (4) Date: Feb. 28, 2013

(87) PCT Pub. No.: WO2012/029671
PCT Pub. Date: Mar. 8, 2012

(65) Prior Publication Data
US 2013/0153941 A1 Jun. 20, 2013

(30) Foreign Application Priority Data
Sep. 2, 2010 (JP) .................................. 2010-197198

(51) Int. Cl.
*H01L 29/18* (2006.01)
*H01L 33/00* (2010.01)
(Continued)

(52) U.S. Cl.
CPC ............ *H01L 28/40* (2013.01); *G02F 1/13454* (2013.01); *G02F 1/136277* (2013.01);
(Continued)

(58) Field of Classification Search
USPC .................................................. 257/88, 532
See application file for complete search history.

(56) References Cited

U.S. PATENT DOCUMENTS 4,922,138 A 5/1990 Hashimoto et al.
8,106,400 B2 * 1/2012 Miyairi et al. ................... 257/72
(Continued)

FOREIGN PATENT DOCUMENTS

JP 63-292772 A 11/1988
JP 2003-132674 A 5/2003
(Continued)

OTHER PUBLICATIONS

Official Communication issued in International Patent Application No. PCT/JP2011/069346, mailed on Dec. 6, 2011.

*Primary Examiner* — Khaja Ahmad
(74) *Attorney, Agent, or Firm* — Keating & Bennett, LLP

(57) ABSTRACT

A semiconductor device (10) provided with at least a plurality of transistors and bootstrap capacitors (Ca1 and Cb1), the semiconductor device (10) includes: a semiconductor layer (22) made of the same material as a channel layer of each of the transistors; a capacitor electrode (24) formed in an upper layer of the semiconductor layer (22); and a clock signal line (17) formed in an upper layer of the capacitor electrode (24), the capacitor electrode (24) being connected to a gate electrode of each of the transistors, the clock signal line (17) being supplied with a clock signal (CK) from outside the semiconductor device (10), the capacitors (Ca1 and Cb1) each being formed in an overlap section where the semiconductor layer (22), the gate insulating film (23) and the capacitor electrode (24) overlap one another, the overlap section and the clock signal line (17) overlapping each other when viewed from above.

10 Claims, 7 Drawing Sheets

(51) Int. Cl.
  *H01L 21/02* (2006.01)
  *H01L 49/02* (2006.01)
  *G09G 3/36* (2006.01)
  *H01L 27/04* (2006.01)
  *H01L 33/08* (2010.01)
  *H01L 27/12* (2006.01)
  *G02F 1/1345* (2006.01)
  *G02F 1/1362* (2006.01)

(52) U.S. Cl.
  CPC ...... *G09G3/3648* (2013.01); *G09G 2310/0286* (2013.01); *H01L 27/04* (2013.01); *H01L 33/08* (2013.01); *H01L 27/1255* (2013.01); *G09G 3/3611* (2013.01)

(56) References Cited

U.S. PATENT DOCUMENTS

| | | | |
|---|---|---|---|
| 2002/0113287 A1* | 8/2002 | Lee et al. | 257/503 |
| 2003/0081490 A1 | 5/2003 | Nagasawa et al. | |
| 2005/0072754 A1* | 4/2005 | Shih et al. | 216/23 |
| 2010/0026619 A1 | 2/2010 | Umezaki | |
| 2010/0244946 A1 | 9/2010 | Murakami et al. | |

FOREIGN PATENT DOCUMENTS

| | | |
|---|---|---|
| JP | 2007-151092 A | 6/2007 |
| WO | 2009/084272 A1 | 7/2009 |

* cited by examiner

SEMICONDUCTOR DEVICE, SEMICONDUCTOR DEVICE UNIT, ACTIVE MATRIX SUBSTRATE, LIQUID CRYSTAL PANEL, AND LIQUID CRYSTAL DISPLAY

TECHNICAL FIELD

The present invention relates to a semiconductor device, a semiconductor device unit, an active matrix substrate, a liquid crystal panel, and a liquid crystal display device each of which includes a transistor and a bootstrap capacitor, and in particular, is related to a technique for reducing a layout area.

BACKGROUND ART

Among liquid crystal display devices, some liquid crystal display devices include a liquid crystal panel where a display section and a peripheral circuit such as a driver circuit are fabricated on a single substrate. The liquid crystal display devices each including such a liquid crystal panel is capable of achieving simplification of a panel mounting process, reduction in mounting area which reduction leads to a narrower frame, a smaller size, and a smaller weight, and the like, as compared to conventional liquid crystal display devices for each of which an IC for realizing a peripheral circuit is provided externally but not on a glass substrate.

Examples of the peripheral circuit encompass a buffer circuit, a level shifter circuit, and the like in addition to driver circuits such as a gate driver, a CS driver and a source driver. These peripheral circuits each are configured by a semiconductor circuit (semiconductor device) including a transistor, and the like.

The transistor here has a predetermined threshold voltage. Accordingly, a potential level of an output signal of the transistor decreases due to voltage drop that is caused by the threshold voltage of the transistor itself. On this account, when a circuit configuration is designed, it has been required to take the threshold voltage into consideration for obtaining an output at a desired potential level from the transistor. The peripheral circuit is required to provide an output at a predetermined potential level, so as to cause a circuit in a subsequent stage to stably operate without malfunctioning and so as to normally and sequentially drive pixels disposed in a display section.

In view of this, a technique called a bootstrap operation is proposed (See Patent Literatures 1 and 2, for example). In the bootstrap operation, a potential level of a signal is increased (pumped up) so that the signal satisfies a sufficient potential level.

The following discusses the bootstrap operation with reference to a semiconductor device described in Patent Literature 2.

FIG. 6 is a circuit diagram illustrating a configuration of a semiconductor device 1 described in Patent Literature 2. As illustrated in FIG. 6, the semiconductor device 1 includes a transistor Ta1, a transistor Ta2, a transistor Ta3, a transistor Ta4, a transistor Ta5, a transistor Tb1, a transistor Tb2, a transistor Tb3, a transistor Tb4, a transistor Tb5, a capacitor Ca1, and a capacitor Cb1. All the transistors are n-channel type MOS transistors. The semiconductor device 1 is configured as a memory circuit including transistors of an identical power supply type.

Further, the semiconductor device 1 is configured so that the semiconductor device 1 can be connected to a power supply VDD and a power supply VSS. In this configuration, for example, the power supply VDD has a positive potential, while the power supply VSS is GND. However, the configuration of the semiconductor device 1 is not limited to this configuration.

Further, the semiconductor device 1 is configured to receive input of an input signal IN, an inversion input signal INB (an inversion signal of the input signal IN), a clock signal CK, and an enable signal EN and to output an output signal OUT and an inversion output signal OUTB (an inversion signal of the output signal OUT). The input signal IN, the inversion input signal INB, the clock signal CK, the enable signal EN, the output signal OUT, and the inversion output signal OUTB become a high level when active. Meanwhile, these signals become a low level when inactive. The following assumes that (i) at the high level, these signals each have a potential equal to a potential of the power supply VDD and (ii) at the low level, these signals each have a potential equal to a potential of the power supply VSS.

Note that because the input signal IN, the inversion input signal INB, the clock signal CK, the enable signal EN, the output signal OUT, and the inversion output signal OUTB are input signals each inputted via a terminal (electrode) or output signals each outputted via a terminal (electrode), for convenience of explanation, hereinafter, the input signal IN is also referred to as an input terminal IN, the inversion input signal INB as an inversion input terminal INB, the clock signal CK as a clock terminal CK, the enable signal EN as an enable terminal EN, the output signal OUT as an output terminal OUT, and the inversion output signal OUTB as an inversion output terminal OUTB.

The transistor Ta1 is configured such that a drain terminal of the transistor Ta1 is connected to the power supply VDD, and a gate terminal of the transistor Ta1 is connected to a source terminal of the transistor Ta5 and the output terminal OUT. Further, a source terminal of the transistor Ta1 is connected to a gate terminal of the transistor Ta2 and a drain terminal of the transistor Ta3, and also connected to the clock terminal CK via the capacitor Ca1. The transistor Ta2 is configured such that a drain terminal of the transistor Ta2 is connected to the power supply VDD, and a source terminal of the transistor Ta2 is connected to a drain terminal of the transistor Ta4 and the output terminal OUT. The transistor Ta3 is configured such that a gate terminal of the transistor Ta3 is connected to the inversion output terminal OUTB and a source terminal of the transistor Ta3 is connected to the power supply VSS. The transistor Ta4 is configured such that a gate terminal of the transistor Ta4 is connected to the inversion output terminal OUTB and a source terminal of the transistor Ta4 is connected to the power supply VSS. The transistor Ta5 is configured such that a drain terminal of the transistor Ta5 is connected to the input terminal IN and a gate terminal of the transistor Ta5 is connected to the enable terminal EN.

The transistor Tb1 is configured such that a drain terminal of the transistor Tb1 is connected to the power supply VDD, and a gate terminal of the transistor Tb1 is connected to a source terminal of the transistor Tb5 and the inversion output terminal OUTB. Further, a source terminal of the transistor Tb1 is connected to a gate terminal of the transistor Tb2 and a drain terminal of the transistor Tb3, and also connected to the clock terminal CK via the capacitor Cb1. The transistor Tb2 is configured such that a drain terminal of the transistor Tb2 is connected to the power supply VDD, and a source terminal of the transistor Tb2 is connected to a drain terminal of the transistor Tb4 and the inversion output terminal OUTB. The transistor Tb3 is configured such that a gate terminal of the transistor Tb3 is connected to the output terminal OUT, and a source terminal of the transistor Tb3 is connected to the power supply VSS. The transistor Tb4 is configured such that a gate terminal of the transistor Tb4 is connected to the output terminal OUT and a source terminal of the transistor Tb4 is connected to the power supply VSS. The transistor Tb5 is configured such that a drain terminal of the transistor Tb5 is connected to the inversion input terminal INB, and a gate terminal of the transistor Tb5 is connected to the enable terminal EN.

Note that a joint between the capacitor Ca1 and each of the transistors Ta1, Ta2, and Ta3 is referred to as a node na1. Meanwhile, a joint between the capacitor Cb1 and each of the transistors Tb1, Tb2, and Tb3 is referred to as a node nb1.

Next, the following explains an operation of the semiconductor device 1 that is configured as described above.

FIG. 7 is a timing chart illustrating respective wave forms of various signals in the semiconductor device 1. Here, the explanation is given on a case where, after a period A in which a high-level (VDD) output signal OUT is outputted and a low-level (VSS) inversion output signal OUTB is outputted, the period A shifts to a period B in which a low-level output signal OUT is outputted and a high-level inversion output signal OUTB is outputted.

(Period A)

In the semiconductor device 1 into which the clock signal CK is inputted, the input signal IN becomes a high level and the inversion input signal INB becomes a low level. Subsequently, when the enable signal EN becomes a high level, the transistors Ta5 and Tb5 are turned ON. The clock signal CK shows a wave form that periodically repeats the high level and the low level. The clock signal CK is inputted at a frequency that is higher than respective frequencies of the output signal OUT and the inversion output signal OUTB.

At this time, because the transistor Ta5 is ON and the input signal IN is at a high level, the transistor Ta1 is turned ON. This causes a potential of the node na1 to be VDD−Vth (precharge operation), where a threshold voltage of the transistor Ta1 is Vth. When the potential of the node na1 increases, the transistor Ta2 is turned ON.

Then, when the enable signal EN shifts from a high level to a low level, the transistor Ta5 and the transistor Ta1 are turned OFF. As a result, the node na1 becomes a floating state while keeping a high charge. In this state, when the clock signal CK becomes a high level, the potential of the node na1 is pumped up by a potential of α due to the clock signal CK so as to become Vdd−Vth+α. When this potential of the node na1 is higher than VDD+Vth, the transistor Ta2 outputs VDD to the output terminal OUT.

When the potential of the node na1 is pumped up due to clock signal CK as described above, a high-potential signal is inputted into the gate terminal of the transistor Ta2. Accordingly, a signal at a VDD potential level, that is, a signal that has not suffered threshold drop is outputted from the transistor Ta2 to the output terminal OUT.

Note that after the enable signal EN once becomes a high level, a high-level signal can be consistently inputted into the gate terminal of the transistor Ta1 as long as the output signal OUT is at a high level. Even when the enable signal EN becomes a low level, the high-level signal can be inputted as long as the output signal OUT is at a high level. This makes it possible to keep a high-level output signal OUT.

Further, the output terminal OUT and the gate terminal of the transistor Ta1 are connected to each other. Accordingly, while the high-level output signal OUT is being outputted, the transistor Ta1 is turned ON when the potential of the node na1 becomes Vdd−Vth or lower. Note that when the potential of the node na1 is Vdd−Vth or higher, the transistor Ta1 is turned OFF and the node na1 becomes a floating state.

Consequently, while the high-level output signal OUT is being outputted, the potential of the node na1 is recharged to Vdd−Vth (refresh operation) by the transistor Ta1 even when the potential of the node na1 decreases due to off leakage or the like. This makes it possible to pump up the potential of the node na1 to Vdd−Vth+α while a high-level clock signal CK is being outputted. Therefore, a VDD output signal OUT can be stably outputted.

Meanwhile, while the high-level output signal OUT is being outputted, the transistors Tb3 and Tb4 are turned ON. As a result, an electric charge of the node nb1 is discharged and the inversion output signal OUTB becomes a low level.

(Period B)

Next, when the input signal IN becomes a low level and the inversion input signal INB becomes a high level and subsequently, the enable signal EN becomes a high level, the transistors Ta5 and Tb5 are turned ON.

At this time, because the transistor Tb5 is ON and the inversion input signal INB is at a high level, the transistor Tb1 is turned ON. This subsequently causes a potential of the node nb1 to be Vdd−Vth (precharge operation), where Vth is a threshold voltage of the transistor Tb1. When the potential of the node nb1 increases, the transistor Tb2 is turned ON.

Then, when the enable signal EN shifts from a high level to a low level, the transistors Tb5 and Tb1 are turned OFF. Further, the node nb1 becomes a floating state while keeping a high charge. In this state, when the clock signal CK becomes a high level, the potential of the node nb1 is pumped up by a potential of α due to the clock signal CK and becomes VDD−Vth+α. When this potential of the node nb1 is higher than VDD+Vth, the transistor Tb2 outputs VDD to the inversion output terminal OUTB.

When the potential of the node nb1 is pumped up due to the clock signal CK as described above, a high-potential signal is inputted into the gate terminal of the transistor Tb2. Accordingly, a signal at a VDD potential level, that is, a signal that has not suffered threshold drop is outputted from the transistor Tb2 to the inversion output terminal OUTB.

Note that in the same manner as described above, after the enable signal EN once becomes a high level, a high-level signal can be consistently inputted into the gate terminal of the transistor Tb1 as long as the inversion output terminal OUTB is at a high-level. Even when the enable signal EN becomes a low level, the high-level signal can be inputted as long as the inversion output terminal OUTB is at a high-level. This makes it possible to keep a high-level inversion output signal OUTB.

Further, while the high-level inversion output signal OUTB is being outputted, the potential of the node nb1 is recharged to Vdd−Vth (refresh operation) by the transistor Tb1 even when the potential of the node nb1 decreases due to off leakage or the like. This makes it possible to pump up the potential of the node nb1 to Vdd−Vth+α while a high-level clock signal CK is being outputted. Therefore, a VDD inversion output signal OUTB can be stably outputted.

Meanwhile, while the high-level inversion output signal OUTB is being outputted, the transistor Ta3 and Ta4 are turned ON. As a result, an electric charge of the node na1 is discharged and the output signal OUT becomes a low level.

As described above, in the period A, the high-level output signal OUT and a low-level inversion output signal OUTB are outputted, while in period B, a low-level output signal OUT and the high-level inversion output signal OUTB are outputted. In accordance with a timing at which the enable signal EN becomes a high level, the periods A and B are switched. When one of the output signal OUT and the inversion output signal OUTB outputted is a VDD signal, the other one of the output signal OUT and the inversion output signal OUTB outputted is a VSS signal.

Note that an amplitude of the clock signal CK, and a capacitance Ca1 and a capacitance Cb1 are set so that respective pumped-up potentials (Vdd−Vth+α) of the nodes na1 and nb1 become VDD+Vth or higher.

As described above, in the semiconductor device 1, a frequency of the clock signal CK is set so as to be higher than a frequency of each of the output signal OUT and the inversion output signal OUTB. Therefore, even when respective potentials of the nodes na1 and nb1 decrease due to off leakage or the like, it is possible to pump up the respective potentials of the nodes na1 and nb1 to VDD+Vth or higher by a pump-up operation caused by the clock signal CK before the enable signal EN becomes a high level next time. That is, the semiconductor device 1 is configured such that respective potential levels of the nodes na1 and nb1 are increased by a bootstrap operation so as to satisfy a sufficient potential level.

Accordingly, it becomes possible to stably output VDD from the output terminal OUT and the inversion output terminal OUTB. This makes it possible to obtain a stable operation in a circuit of a subsequent stage that is connected to the output terminal OUT and the inversion output terminal OUTB.

CITATION LIST

Patent Literatures

[Patent Literature 1]
Japanese Patent Application Publication, Tokukaishou, No. 63-292772 (Publication Date: Nov. 30, 1988)
[Patent Literature 2]
Pamphlet of International Publication No. WO2009/084272 (Publication Date: Jul. 9, 2009)

SUMMARY OF INVENTION

Technical Problem

However, in the semiconductor device 1, because the capacitors Ca1 and Cb1 are mounted for the purpose of obtaining a bootstrap operation, a layer area increases for formation of the capacitors Ca1 and Cb1.

FIG. 8 illustrates a layout pattern of the semiconductor device 1 viewed from above. As illustrated in FIG. 8, for preventing influence of noise, capacitors Ca1 and Cb1 are disposed in an area between a line for supplying a clock signal CK and a line for providing a power supply VDD when viewed from above. It is clearly understood from FIG. 8, that in the semiconductor device 1, a layout area increases as compared a case where no capacitor is formed. Further, unless a bootstrap capacitor has a capacitance that is sufficiently large as compared to a gate input capacitance of a transistor to which the bootstrap capacitor is connected or a parasitic capacitance of other line to which the bootstrap capacitor is connected, an increase in potential level caused by bootstrap becomes insufficient. Therefore, a large layout area is required for ensuring a sufficient capacitance.

Further, in some cases, it is difficult to ensure a space required for obtaining a necessary capacitance, due to reduction in size of a product (narrowing of a frame of a liquid crystal panel) or restriction caused by a design of a product. This problem concerning restriction on a layout area becomes more significant as a necessary capacitance becomes larger.

The present invention is attained in view of the above conventional problem and an object of the present invention is to provide a semiconductor device, a semiconductor device unit, an active matrix substrate, a liquid crystal panel, and a liquid crystal display device each of which is capable of reducing a layout area in a configuration including a transistor and a bootstrap capacitor.

Solution to Problem

In order to solve the above problem, a semiconductor device of the present invention including at least a transistor and a bootstrap capacitor, the semiconductor device is configured to includes: a first electrode made of a material that is the same as a material of a channel layer of the transistor; a second electrode formed in an upper layer of the first electrode; a control signal line formed in an upper layer of the second electrode; a first insulating film provided between the first electrode and the second electrode; and a second insulating film provided between the second electrode and the control signal line, the second electrode being connected to a gate electrode of the transistor, the control signal line being supplied with a control signal from outside the semiconductor device, the bootstrap capacitor being formed in an overlap section where the first electrode, the first insulating film and the second electrode overlap one another, the overlap section and the control signal line overlapping each other when viewed from above.

In general, in a semiconductor device including a capacitor, a layout space is used for forming the capacitor. However, in a layout pattern in the configuration as described above, the overlap section is disposed so as to overlap with the control signal line. Therefore, the above configuration makes it possible to reduce a layout space that is used only for formation of the capacitor. Consequently, the semiconductor device of the present invention can reduce the layout area.

Further, in the above configuration, a potential of a gate electrode of the transistor is increased by a bootstrap operation. This makes it possible to cause the transistor to output a signal that is free from threshold drop. At this time, a large capacitance is required for sufficiently increasing a level of the potential by the bootstrap, which leads to a significant increase in layout area for the capacitor. The above configuration makes it possible particularly to reduce a layout area.

A semiconductor device unit of the present invention includes a plurality of semiconductor devices as described above, the plurality of semiconductor devices sharing the control signal line.

An active matrix substrate of the present invention includes a display section and a driver circuit which is monolithically formed on the active matrix substrate, the driver circuit including the semiconductor device or the semiconductor device unit.

A liquid crystal panel of the present invention includes the active matrix substrate.

A liquid crystal display device of the present invention includes the liquid crystal panel.

Advantageous Effects of Invention

As described above, a semiconductor device of the present invention is configured to include: a first electrode made of a material that is the same as a material of a channel layer of the transistor; a second electrode formed in an upper layer of the first electrode; a control signal line formed in an upper layer of the second electrode; a first insulating film provided between the first electrode and the second electrode; and a second insulating film provided between the second electrode and the control signal line, the second electrode being connected to a gate electrode of the transistor, the control signal line being supplied with a control signal from outside the semiconductor device, the bootstrap capacitor being formed in an overlap section where the first electrode, the first insulating film and the second electrode overlap one another, the overlap section and the control signal line overlapping each other when viewed from above.

Therefore, it becomes possible to reduce a layout space that is used only for formation of a capacitor and consequently to reduce a layout area.

Further, a semiconductor device unit of the present invention, an active matrix substrate of the present invention, a liquid crystal panel of the present invention, and a liquid crystal display device of the present invention each are configured to include the semiconductor device, reduction in layout area becomes possible. This makes it possible to achieve a narrower frame, a reduced size, a reduced weight, and the like.

DESCRIPTION OF EMBODIMENTS

The present invention is characterized by a layout pattern of a semiconductor device that includes a transistor and a bootstrap capacitor. This layout pattern characterizing the present invention provides an effect such that a layout area can be reduced. Therefore, as long as a circuit employing the present invention is realized by a semiconductor device including at least a transistor and a bootstrap capacitor, it does not matter whether or not a configuration of the circuit is well-known. In other words, the effect of the present invention can be obtained even when the present invention is applied to a conventional semiconductor device including at least a transistor and a bootstrap capacitor. The circuit employing the present invention is explained below in detail.

Figure 6:
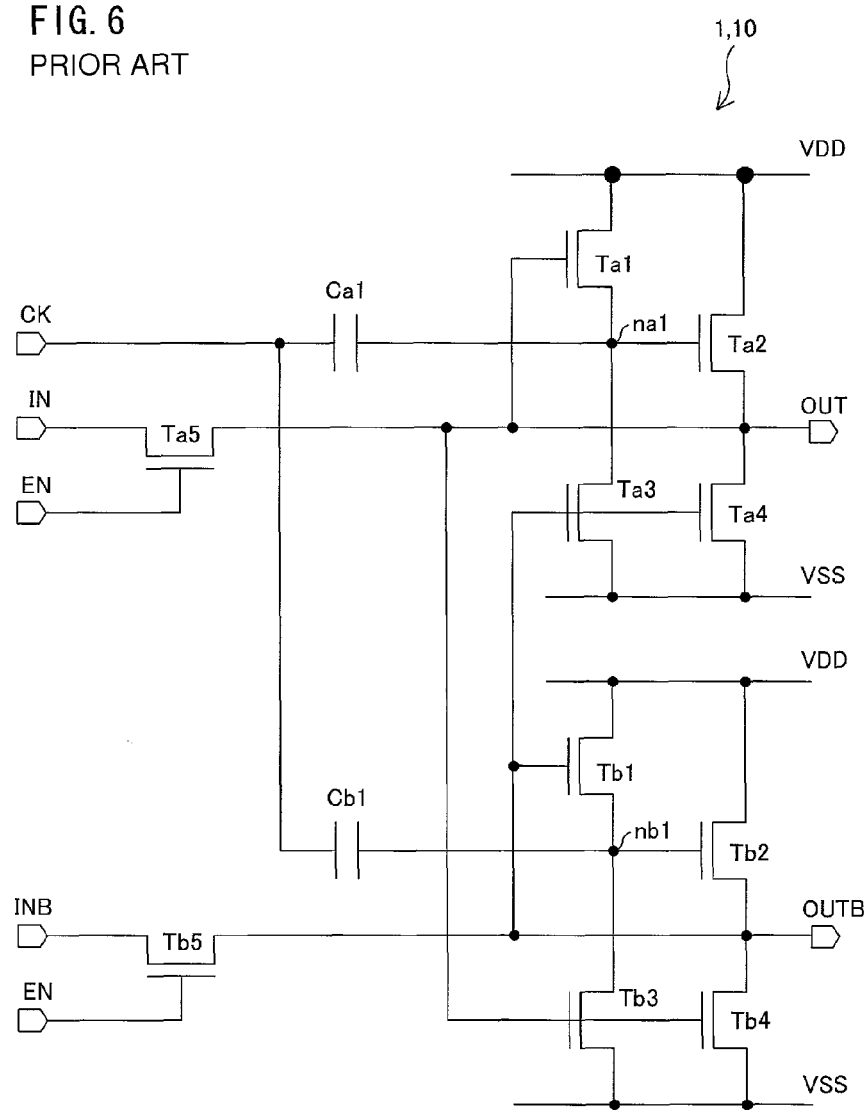
FIG. 6 is a circuit diagram illustrating a configuration of a conventional semiconductor device.
Figure 7:
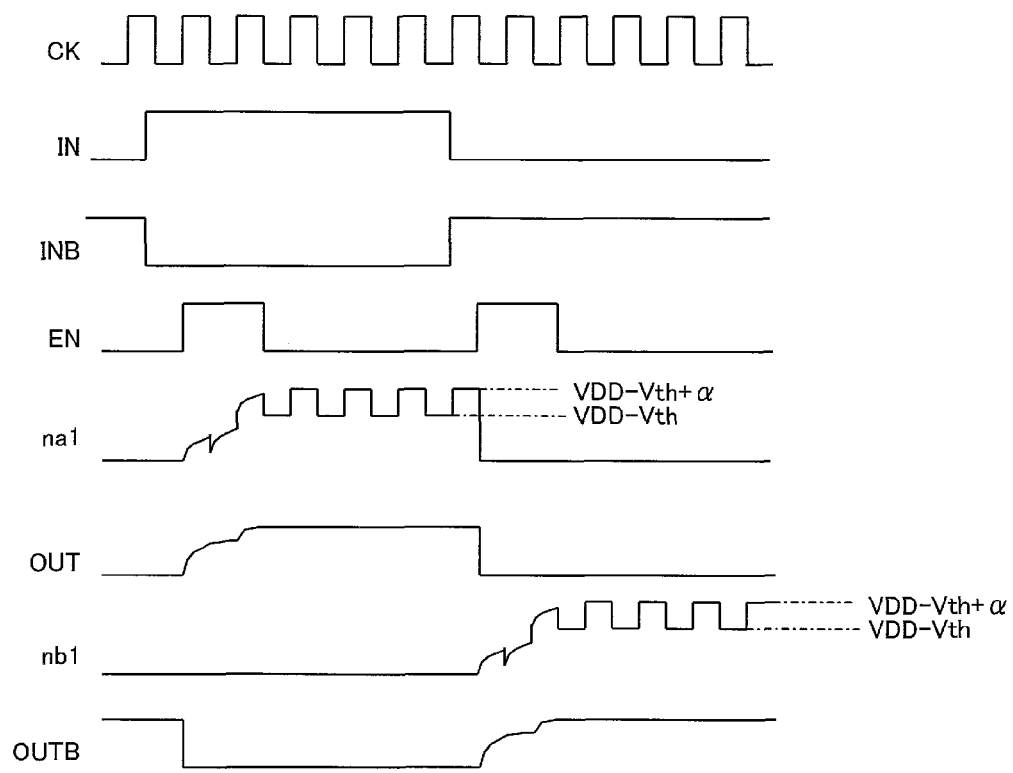
FIG. 7 is a timing chart illustrating respective wave forms of various signals in the semiconductor device of FIG. 6.

For easy-to-understand illustration of the effect of the present invention, that is, reduction in layout area, each embodiment is explained by using a semiconductor device 10 that has the same circuit configuration as a semiconductor device 1 illustrated in FIG. 6. Note that the semiconductor device 10 has a circuit configuration that is described in Background Art above and therefore, an explanation of the circuit configuration is omitted as appropriate.

EMBODIMENT 1

The following discusses one embodiment of the present invention, with reference to drawings.

Figure 1:
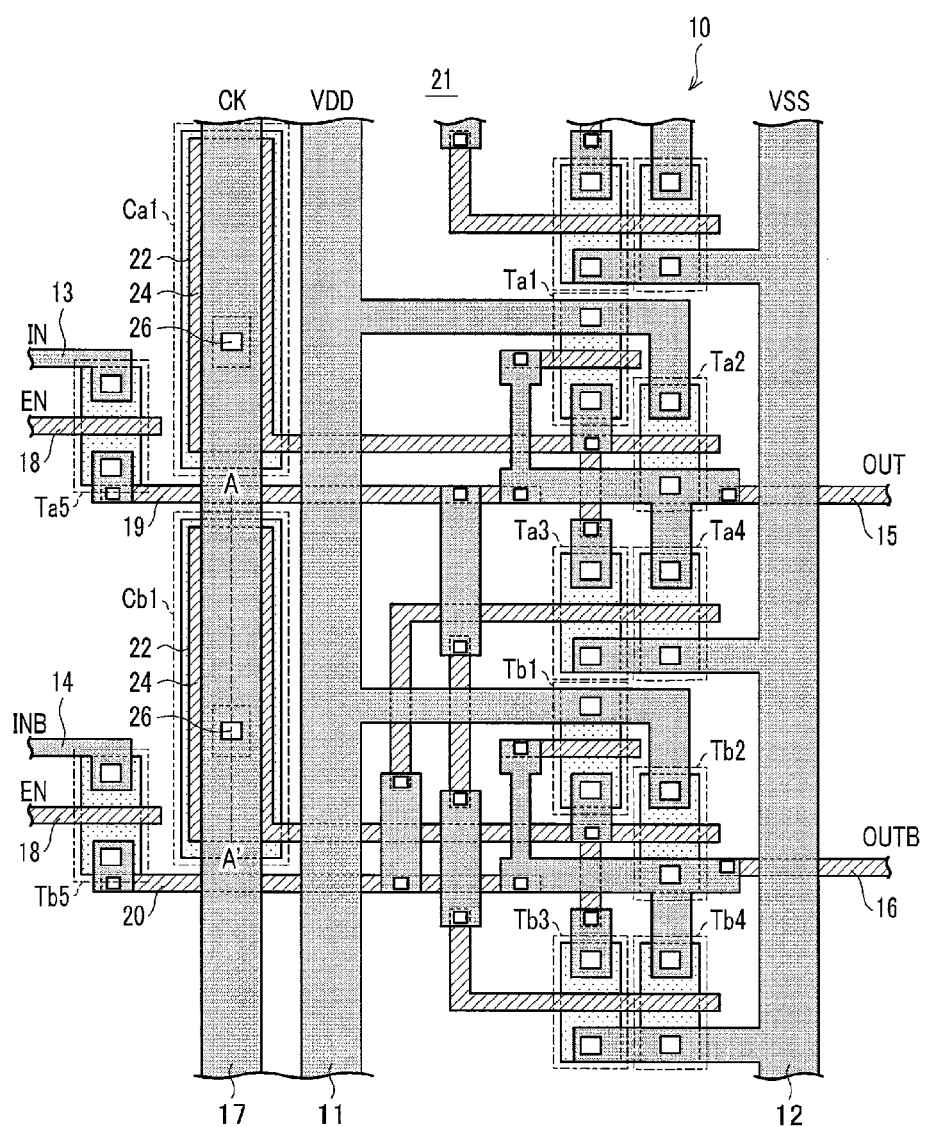
FIG. 1 illustrates one embodiment of a semiconductor device of the present invention and is a plan view illustrating a layout pattern of the semiconductor device.

FIG. 1 is a plan view illustrating a layout pattern of the semiconductor device 10 in accordance with Embodiment 1 in a case where the semiconductor device 10 is viewed from above. The semiconductor device 10 includes a transistor Ta1, a transistor Ta2, a transistor Ta3, a transistor Ta4, a transistor Ta5, a transistor Tb1, a transistor Tb2, a transistor Tb3, a transistor Tb4, a transistor Tb5, a capacitor Ca1, and a capacitor Cb1. Specifically, the semiconductor device 10 is realized by formation of the above components on a substrate 21, as illustrated in FIG. 1.

Further, as illustrated in FIG. 1, on the substrate 21, the following lines are formed: a power supply line 11 for providing a power supply VDD, a power supply line 12 for providing a power supply VSS, an input line 13 for inputting an input signal IN, an input line 14 for inputting an inversion input signal INB, an output line 15 for outputting an output signal OUT, an output line 16 for outputting an inversion output signal OUTB, a clock signal line 17 for supplying a clock signal CK, and an enable signal line 18 for inputting an enable signal EN.

Here, the semiconductor device 10 is formed by forming (laminating), on the substrate 21, a semiconductor layer, a gate insulating film, gate metal (hereinafter, referred to as GM), an interlayer insulating film, and source metal (hereinafter, referred to as SM) in this order. These component elements can be formed by, for example, a conventional common method for monolithically fabricating a semiconductor device on a substrate. In FIG. 1, dotted sections indicate a semiconductor layer, hatched sections indicate GM, and gray sections indicate SM. Note that in FIG. 1, the gate insulating film and the interlayer insulating film are transmissive layers.

That is, these component elements constitute the transistors Ta1, Ta2, Ta3, Ta4, Ta5, Tb1, Tb2, Tb3, Tb4, and Tb5, the capacitors Ca1 and Cb1, the power supply lines 11 and 12, the input lines 13 and 14, the output lines 15 and 16, the clock signal line 17, and the enable signal line 18.

In each of the transistors Ta1, Ta2, Ta3, Ta4, Ta5, Tb1, Tb2, Tb3, Tb4, and Tb5, a semiconductor layer corresponds to the semiconductor layer, a gate electrode corresponds to GM, and a drain and source electrodes correspond to SM. In each of the capacitors Ca1 and Cb1, a semiconductor layer 22 corresponds to the semiconductor layer, and a capacitor electrode 24 corresponds to GM. The power supply lines 11 and 12, the input lines 13 and 14, and the clock signal line 17 each correspond to SM. The output lines 15 and 16 and the enable signal line 18 each correspond to GM. Electrodes or layers of one group (e.g., GM) each are fabricated in a single production process and have an identical thickness.

Note that in the following description, on the substrate 21 on which the above components are formed, a direction in which the clock signal line 17 extends is defined as a vertical direction and a direction orthogonal to the vertical direction is defined as a horizontal direction. However, these vertical and horizontal directions by no means limit actual applications.

(Configuration of Signal Lines)

The power supply line 11, the power supply line 12, and the clock signal line 17 are formed so as to extend in the vertical direction. These signal lines are disposed in the order of the clock signal line 17, the power supply line 11, and the power supply line 12 in the horizontal direction (here, from left to right). The power supply line 11, the power supply line 12, and the clock signal line 17 each have an identical predetermined width. However, the configuration of the power supply line 11, the power supply line 12, and the clock signal line 17 is not limited to this.

Meanwhile, the input line 13, the input line 14, and the enable signal line 18 are formed so as to extend in the horizontal direction. When viewed from above, the input line 13, the input line 14, and the enable signal line 18 are disposed on an opposite side of the clock signal line 17 with respect to the power supply line 11. The input line 13 is connected to the drain electrode of the transistor Ta 5 via a contact hole. The input line 14 is connected to the drain electrode of the transistor Tb 5 via a contact hole. The enable signal line 18 is connected to the respective gate electrodes of the transistors Ta5 and Tb5. Note that though in FIG. 1, the enable signal line 18 is illustrated as if the enable signal line 18 were formed at two positions, the enable signal line is continuous in a section that is not illustrated. The input line 13, the input line 14, and the enable signal line 18 each has an identical predetermined width that is narrower than a width of the power supply line 11 or the like. However, the configuration of the input line 13, the input line 14, and the enable signal line 18 is not limited to this.

The output line 15 and the output line 16 are formed so as to extend in the horizontal direction. The output line 15 and the output line 16 are disposed so as to be orthogonal to the power supply line 12 when viewed from above. The output line 15 is connected to the source electrode of the transistor Ta2 via a leader line and a contact hole. The output line 16 is connected to the source electrode of the transistor Tb2 via a leader line and a contact hole. The output line 15 and the output line 16 each have an identical predetermined width that is narrower than the width of the power supply line 11 or the like. However, the configuration of the output line 15 and the output line 16 is not limited to this.

(Configuration of Transistors)

The above transistors except the transistors Ta5 and Tb5 are laid out in an area between the power supply lines 11 and 12 when viewed from above. The transistors Ta5 and Tb5 are laid out in an opposite area of the clock signal line 17 with respect to the power supply line 11 when viewed from above.

The transistors Ta1 and Ta2 are provided so as to be adjacent to each other in the horizontal direction. In this configuration, the transistor Ta1 is disposed on a power supply line 11 side, while the transistor Ta2 is disposed on a power supply line 12 side. Further, the transistors Ta1 and Ta2 are provided so that the drain electrode and the source electrode of each of the transistors Ta1 and Ta2 face each other in the vertical direction. The source electrode of the transistor Ta1 and the drain electrode of the transistor Ta2 are positioned on a line along the horizontal direction.

The transistors Ta3 and Ta4 are provided so as to be adjacent to each other in the horizontal direction. In this configuration, the transistor Ta3 is disposed on the power supply line 11 side, while the transistor Ta4 is disposed on the power supply line 12 side. Further, the transistor Ta3 and the transistor Ta4 are configured so that the drain electrode and the source electrode of each of the transistors Ta3 and Ta4 face each other in the vertical direction. The respective drain electrodes of the transistors Ta3 and Ta4 are positioned on a line along the horizontal direction.

The transistor Ta5 is provided in an opposite area of the clock signal line 17 with respect to the power supply line 11 when viewed from above. The transistor Ta5 is disposed so that the drain electrode and the source electrode of the transistor Ta5 face each other in the vertical direction. Further, the source electrode of the transistor Ta5 is positioned in the vicinity of a line extending from the source electrode of the transistor Ta2 along the horizontal direction.

The transistors Tb1 and Tb2 are provided so as to be adjacent to each other in the horizontal direction. In this configuration, the transistor Tb1 is disposed on a power supply line 11 side, while the transistor Tb2 is disposed on a power supply line 12 side. Further, the transistors Tb1 and Tb2 are provided so that the drain electrode and the source electrode of each of the transistors Tb1 and Tb2 face each other in the vertical direction. The source electrode of the transistor Tb1 and the drain electrode of the transistor Tb2 are positioned on a line along the horizontal direction.

The transistors Tb3 and Tb4 are provided so as to be adjacent to each other in the horizontal direction. In this configuration, the transistor Tb3 is disposed on the power supply line 11 side, while the transistor Tb4 is disposed on the power supply line 12 side. Further, the transistor Tb3 and the transistor Tb4 are configured so that the drain electrode and the source electrode of each of the transistors Tb3 and Tb4 face each other in the vertical direction. The respective drain electrodes of the transistors Tb3 and Tb4 are positioned on a line along the horizontal direction.

The transistor Tb5 is provided in an opposite area of the clock signal line 17 with respect to the power supply line 11 when viewed from above. The transistor Tb5 is disposed so that the drain electrode and the source electrode of the transistor Tb5 face each other in the vertical direction. Further, the source electrode of the transistor Tb5 is positioned in a vicinity of a line extending from the source electrode of the transistor Tb2 along the horizontal direction.

Further, the transistors Ta1, Ta3, Tb1, and Tb3 are positioned on a line along the vertical direction. Meanwhile, the transistors Ta2, Ta4, Tb2, and Tb4 are positioned on another line along the vertical direction. The transistors Ta5 and Tb5 are positioned on still another line in the vertical direction.

Next, the following briefly explains a configuration of a transistor by using the transistor Ta1 as an example. Each of the above transistors is formed in an identical configuration though laid out in a different position. The transistor Ta1 is formed from a semiconductor layer, a gate insulating film, a gate electrode, an interlayer insulating film, a drain electrode, and a source electrode that are formed on the substrate 21.

The semiconductor layer is formed on the substrate 21. In the semiconductor layer, each region (each diffusion layer) is formed from amorphous silicon, polysilicon, or the like so that an n-channel transistor is formed. The gate insulating film is formed on the substrate 21 so as to cover the semiconductor layer. The gate insulating film is made of, for example, silicon nitride.

The gate electrode is formed on the gate insulating film. The gate electrode is disposed so as to overlap with the semiconductor layer (specifically, a channel formation region of the semiconductor layer) when viewed from above. The gate electrode may be made of a metal film made of, for example, titanium, chromium, aluminum, molybdenum, tantalum, tungsten, or copper, an alloy film made of some of these metals, or a multilayer film made of the metal film and the alloy film. The interlayer insulating film is formed on the gate insulating film so as to cover the gate electrode. The interlayer insulating film is made of, for example, silicon nitride.

The drain electrode and the source electrode each are formed on the interlayer insulating film. The drain electrode is disposed so as to overlap with the semiconductor layer (specifically, a drain region of the semiconductor layer) when viewed from above, and is connected to this semiconductor layer via a contact hole when viewed from above. Further, the sourced electrode is disposed so as to overlap with the semiconductor layer (specifically, a source region of the semiconductor layer) when viewed from above, and is connected to this semiconductor layer via a contact hole when viewed from above. The drain electrode and the source electrode are disposed so as to sandwich the gate electrode when viewed from above.

Note that respective areas for formation of the above transistors each have an identical size. Further, as illustrated in FIG. 1, the above transistors are electrically connected in accordance with the circuit configuration as illustrated in FIG. 6, via a leader line (SM or GM) and a contact hole that are provided as appropriate.

(Configuration of Capacitors)

The capacitors Ca1 and Cb1 are disposed so as to overlap with the clock signal line 17 (control signal line), when viewed from above. The capacitor Cb1 is disposed in an area between a leader line 19 and a leader line 20. The leader line 19 is provided so as to provide an electrical connection from the source electrode of the transistor Ta5 to the output line 15. The leader line 20 is provided so as to provide an electrical connection from the source electrode of the transistor Tb5 to the output line 16. The capacitor Ca1 is disposed in an opposite area of the leader line 19 with respect to the capacitor Cb1, when viewed from above.

Figure 2:
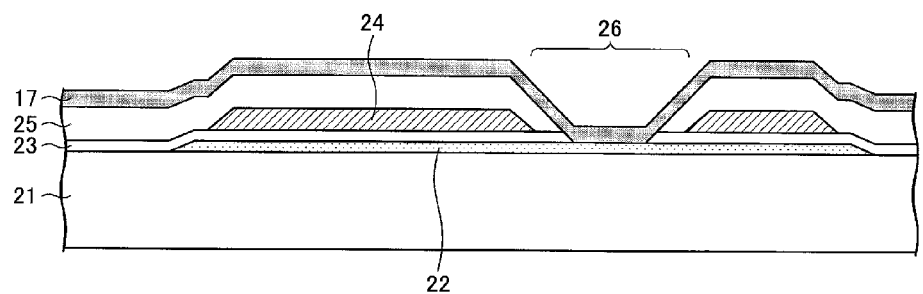
FIG. 2 is a cross sectional view taken along line A-A' of FIG. 1.

Next, the following explains a configuration of each of the above capacitors by using the capacitor Cb1 as an example. The above capacitors each are formed in an identical configuration though laid out in a different position. FIG. 2 illustrates a cross sectional structure of an area where the capacitor Cb1 is formed. FIG. 2 is a cross sectional view taken along line A-A' of FIG. 1.

As illustrated in FIG. 2, in the area where the capacitor Cb1 is formed, the semiconductor layer 22 (first electrode), a gate insulating film 23 (first insulating film), a capacitor electrode 24 (second electrode), an interlayer insulating film 25 (second insulating film), and a clock signal line 17 are stacked in this order on the substrate 21.

The semiconductor layer 22 is formed on the substrate 21. The semiconductor layer 22 has a rectangular shape when viewed from above. The semiconductor layer 22 is provided in an area between the leader line 19 and the leader line 20, and has a longitudinal side of the rectangular shape along the clock signal line 17. In other words, the semiconductor layer 22 is formed in a position at a predetermined distance apart from each of the leader lines 19 and 20. A width in a short side direction of the semiconductor layer 22 is longer than a width of the clock signal line 17 when viewed from above. The semiconductor layer 22 is made of a material which the semiconductor layer (channel layer) of each transistor is made of.

The gate insulating film 23 is formed on the substrate 21 so as to cover the semiconductor layer 22. This gate insulating film 23 is identical to the gate insulating film that is used in the transistors. The capacitor electrode 24 is formed on the gate insulating film 23. The capacitor electrode 24 has a rectangular shape that is a little smaller than that of the semiconductor layer 22 when viewed from above. The capacitor electrode 24 is disposed so as to be positioned inside the semiconductor layer 22 and also to overlap with the semiconductor layer 22 when viewed from above. A width in a short side direction of the capacitor electrode 24 is longer than that of the clock signal line 17 when viewed from above. The capacitor electrode 24 is made of a material which the gate electrode of each of the above transistors is made of.

The clock signal line 17 is formed on the capacitor electrode 24 so that the interlayer insulating film 25 is present between the clock signal line 17 and the capacitor electrode 24. This interlayer insulating film 25 is identical to the interlayer insulating film that is used in the transistors. Further, the clock signal line 17 is connected to the semiconductor layer 22 via a contact hole 26. The clock signal line 17 is insulated from the capacitor electrode 24 by the interlayer insulating film 25.

In the above configuration, a capacitor, that is, the capacitor Cb1 is formed in a section (overlap section) where the semiconductor layer 22, the gate insulating film 23, and the capacitor electrode 24 overlap one another. In this way, the overlap section that becomes the capacitor Cb1 overlaps with the clock signal line 17 when viewed from above. As illustrated in FIG. 2, the clock signal line 17 is present all over the semiconductor layer 22 and the capacitor electrode 24 is positioned right below the clock signal line 17.

Figure 3:
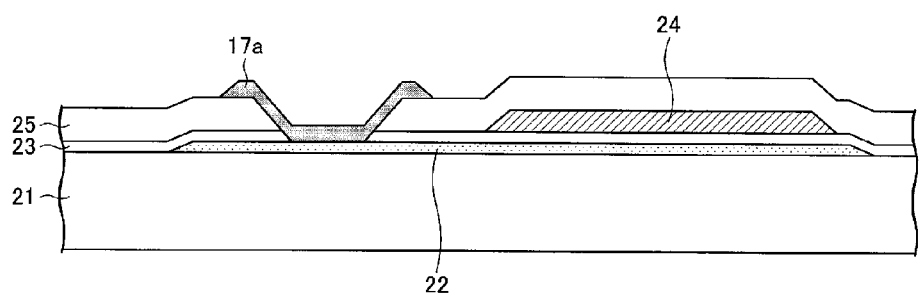
FIG. 3 is a cross sectional view taken along line B-B' of FIG. 8.

For comparison, FIG. 3 illustrates a cross sectional structure of a capacitor Cb1 in a conventional layout pattern. FIG. 3 is a cross sectional view taken along line B-B' of FIG. 8. As illustrated in FIG. 3, in the conventional layout pattern, a section 17a that branches from a line for supplying a clock signal CK is present on a part of the semiconductor layer 22 and the capacitor electrode 24 is not present right below the clock signal line 17 and the section 17a.

As described above, the semiconductor device 10 includes a plurality of transistors and the capacitors Ca1 and Cb1. The semiconductor layer 22 is made of a material which respective channel layers of the plurality of transistors are made of. The clock signal line 17 for supplying the clock signal CK is connected to the semiconductor layer 22 via the contact hole 26. The capacitor electrode 24 is connected to a gate electrode of a transistor. The capacitors Ca1 and Cb1 each are formed in an overlap section where the semiconductor layer 22, the gate insulating film 23, and the capacitor electrode 24 overlap one another. Further, the capacitors Ca1 and Cb1 each have a configuration in which the overlap section overlaps with the clock signal line when viewed from above.

Figure 8:
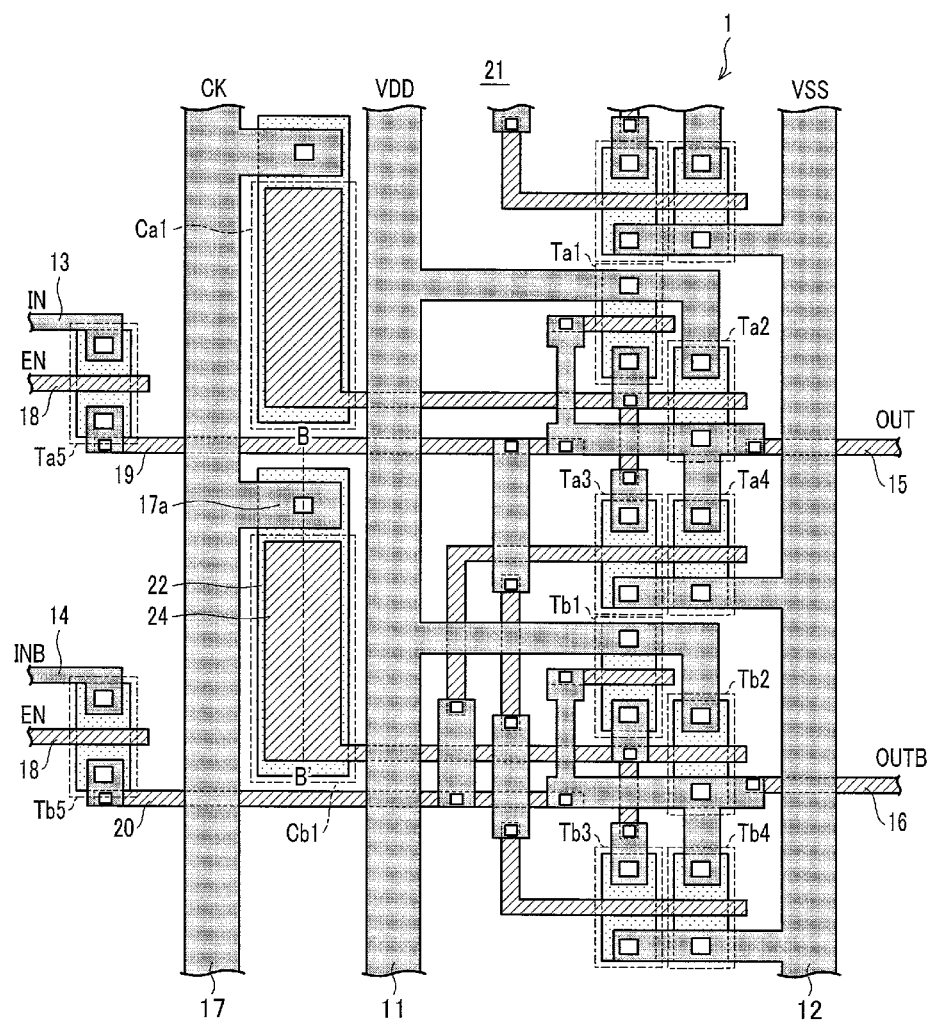
FIG. 8 is a plan view illustrating a layout pattern of the semiconductor device of FIG. 6.

In the semiconductor device 10 that performs a bootstrap operation, it is required that the capacitors Ca1 and Cb1 for performing the bootstrap operation are mounted. In the conventional layout pattern, as illustrated in FIG. 8, a layout space has been used only for formation of the capacitors Ca1 and Cb1.

On the other hand, in the layout pattern of Embodiment 1, as illustrated in FIG. 1, the respective overlap sections that become the capacitors Ca1 and Cb1 are disposed so as to overlap with the clock signal line 17. This makes it possible to reduce a layout space that is used only for forming the capacitors Ca1 and Cb1. Therefore, in the semiconductor device 10 employing the layout pattern of Embodiment 1, a layout area can be reduced. In the example of Embodiment 1, a layout area can be reduced by substantially a width in a short side direction of each of the capacitors Ca1 and Cb1, as compared to the conventional layout pattern.

Further, because the capacitors Ca1 and Cb1 are formed so as to overlap with the clock signal line 17, it is possible to prevent superposition (for example, interfusion, crosstalk, etc.) of noise onto other line (e.g., the power supply line 11) via each of the capacitors Ca1 and Cb1 and to prevent malfunction caused by such superposition as compared to a case where the capacitors Ca1 and Cb1 are formed on other line (e.g., the power supply line 11).

Furthermore, an interlayer parasitic capacitor between the capacitor electrode 24 and the clock signal line 17 also serves as a bootstrap capacitor. Therefore, a bootstrap effect can be enhanced in a case where areas where the capacitors are formed are the same as conventional areas where capacitors are formed.

Further, the capacitors Ca1 and Cb1 are formed so as to stretch beyond the clock signal line 17 when viewed from above. By using a space between the clock signal line 17 and the power supply line 11 in this way, a wide area for formation of each capacitor can be ensured. The area (overlap section) for formation of each capacitor may have a size that is determined in accordance with a desired capacitance. Accordingly, the area for formation of each capacitor may have a size that allows the area to remain within an area right below the clock signal line 17 and also may have any shape when viewed from above.

Note, however, that the layout pattern as described above and illustrated in FIG. 1 is merely one example. As to a layout (e.g., relative positions of the transistors or a position of the power supply line 12) that is not relevant to a characteristic that the area where each of the capacitors Ca1 and Cb1 is formed overlaps with the clock signal 17, modification can be made as appropriate. Moreover, respective widths of SM and GM are not limited to respective widths illustrated in FIG. 1. However, in general, the width of SM is arranged to be greater than the width of GM. Further, the power supply lines 11 and 12 of SM each are provided so as to have a greater width as compared to other lines. Furthermore, though respective areas for formation of transistors have an identical size in Embodiment 1, the respective areas for formation of the transistors may have different sizes. In addition, though one contact hole connects between the semiconductor layer and a line in Embodiment 1, a plurality of contact holes may be formed depending on a size of an area where the semiconductor layer is formed.

Further, though a configuration and an effect of the present invention are described by using the semiconductor device 10 as an example, a semiconductor device to which the present invention is applicable is not limited to the semiconductor device 10.

For example, though the semiconductor device 10 is configured so that a capacitance for bootstrap is formed by using the clock signal CK, a signal used for forming the capacitance for bootstrap may be other control signal (e.g., a signal for determining a polarity, or other signals produced in accordance with the clock signal CK). In such a case, a capacitor for performing the bootstrap should be overlapped with a control signal line (SM) for supplying the capacitor with the control signal that contributes to increasing a potential by a potential of α, when viewed from above. This configuration can provide a substantially same effect as described above.

Further, the semiconductor device may be provided with one capacitor or two or more capacitors. Furthermore, depending on a circuit configuration, a signal line may be connected not to the semiconductor layer but to a capacitor electrode in a section where a capacitor is formed.

In addition, the present invention is applicable not only to a semiconductor device configured to have transistors of an identical conductivity type but also to a semiconductor device configured to have an n-channel transistor and a p-channel transistor mixedly. The p-channel transistor is turned ON by a high-level signal and turned OFF by a low-level signal, while the p-channel transistor is turned ON by a low-level signal and turned OFF by a high-level signal. Such a configuration where the n-channel transistor and the p-channel transistor are mixedly present provides an advantage such as reduction in power consumption in a case where these transistors are made of CMOS transistors. However, this configuration requires separate processes for respectively forming the p-channel transistor and the n-channel transistor. This leads to problems such as complication of a production process and increase in production cost caused by such complication. Therefore, use of a plurality of transistors of an identical conductivity type provides a more significant effect because it becomes possible to simplify a production process.

In this way, the present invention is applicable to any semiconductor device including at least a transistor and a bootstrap capacitor.

EMBODIMENT 2

The following discusses one embodiment of the present invention with reference to drawings. Embodiment 2 deals with a semiconductor device unit including a plurality of semiconductor devices 10 described above. Note that configurations other than configurations explained in Embodiment 2 are the same as those in Embodiment 1. Further, for convenience of explanation, members having identical functions as those illustrated in drawings of Embodiment 1 are given the same reference signs and explanations thereof are omitted.

Figure 4:
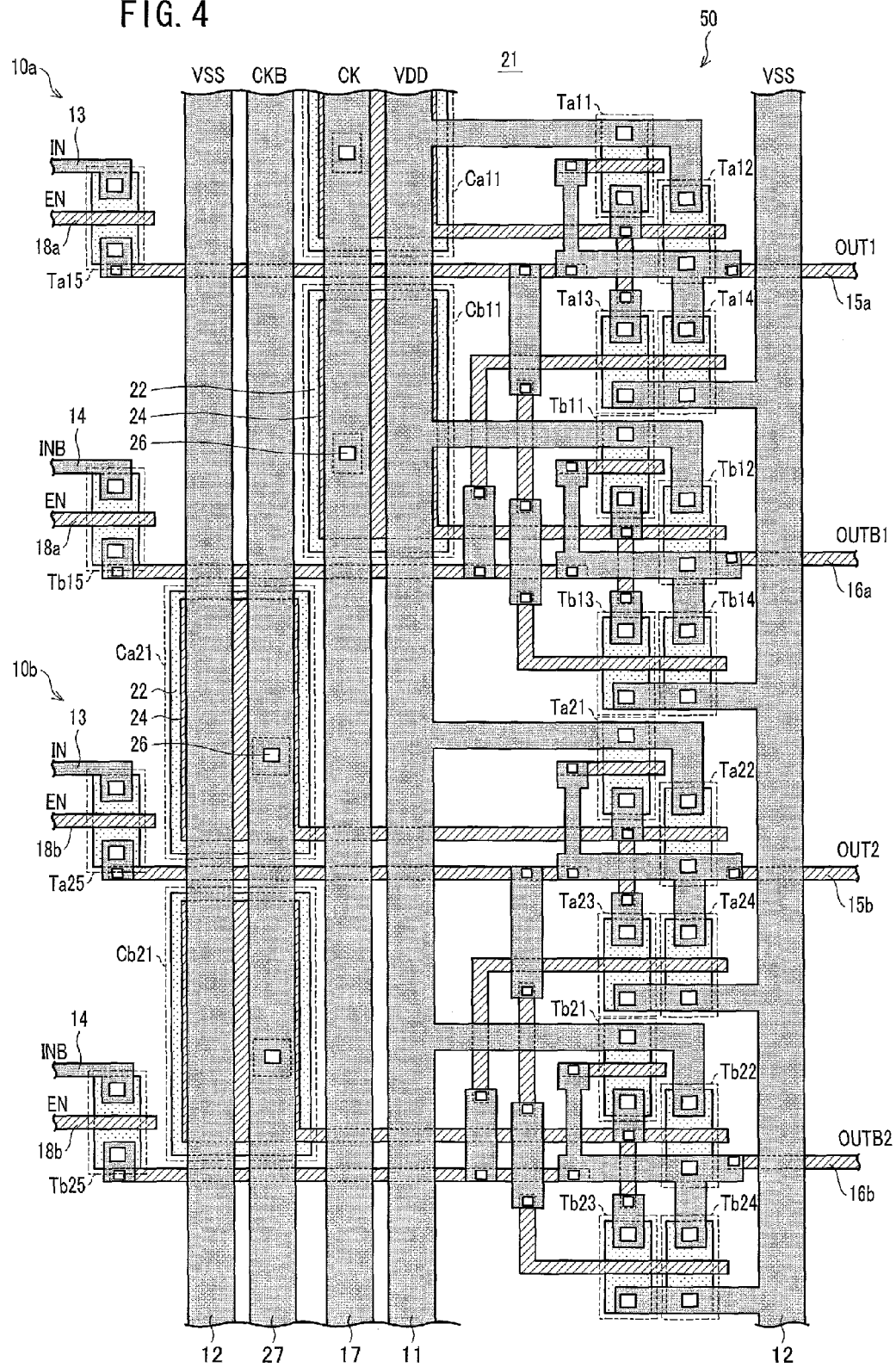
FIG. 4 illustrates one embodiment of a semiconductor device unit of the present invention and illustrates a layout pattern of the semiconductor device unit.

FIG. 4 is a plan view illustrating a layout pattern of a semiconductor device unit 50 of Embodiment 2 in a case where the semiconductor device unit 50 is viewed from above. The semiconductor device unit 50 of Embodiment 2 includes a semiconductor device 10a and a semiconductor device 10b. The semiconductor device 10a and the semiconductor device 10b are aligned along a vertical direction.

The semiconductor device 10a includes a transistor Ta11, a transistor Ta12, a transistor Ta13, a transistor Ta14, a transistor Ta15, a transistor Tb11, a transistor Tb12, a transistor Tb13, a transistor Tb14, a transistor Tb15, a capacitor Ca11, and a capacitor Cb11. These members respectively corresponds to transistors Ta1, Ta2, Ta3, Ta4, Ta5, Tb1, Tb2, Tb3, Tb4, and Tb5, and capacitors Ca1 and Cb1 in the semiconductor device 10. However, the semiconductor device 10a is different from the semiconductor device 10 that has a layout pattern of Embodiment 1, in positions where the capacitors Ca11 and Cb11 are laid out.

The semiconductor device 10b includes a transistor Ta21, a transistor Ta22, a transistor Ta23, a transistor Ta24, a transistor Ta25, a transistor Tb21, a transistor Tb22, a transistor Tb23, a transistor Tb24, a transistor Tb25, a capacitor Ca21, and a capacitor Cb21. These members respectively corresponds to the transistors Ta1, Ta2, Ta3, Ta4, Ta5, Tb1, Tb2, Tb3, Tb4, and Tb5, and the capacitors Ca1 and Cb1 in the semiconductor device 10. However, the semiconductor device 10b is different form the semiconductor device 10 that has the layout pattern of Embodiment 1, in positions where the capacitors Ca21 and Cb21 are laid out.

As illustrated in FIG. 4, on the substrate 21, the following lines are formed: a power supply line 11 for providing a power supply VDD, a power supply line 12 for providing a power supply VSS, an input line 13 for inputting an input signal IN, an input line 14 for inputting an inversion input signal INB, an output line 15a for outputting a first output signal OUT1, an output line 16a for outputting a first inversion output signal OUTB1, an output line 15b for outputting a second output signal OUT2, an output line 16b for outputting a second inversion output signal OUTB2, a clock signal line 17 for supplying clock a signal CK, a clock signal line 27 for supplying an inversion clock signal CKB (an inversion signal of the clock signal CK), an enable signal line 18a for inputting a first enable signal EN1 and an enable signal line 18b for inputting a second enable signal EN2.

The power supply line 11, the power supply line 12, the clock signal line 17, and the clock signal line 27 are formed so as to extend in the vertical direction. In a horizontal direction (from left to right in FIG. 4), the power supply line 12 (one portion of the power supply line 12), the clock signal line 27, the clock signal line 17, the power supply line 11, and the power supply line 12 (the other portion of the power supply line 12) are disposed in this order. Note that in FIG. 4, though the power supply line 12 is illustrated as if the power supply line 12 were provided in two positions, the power supply line is continuous in a section that is not illustrated. The power supply line 11, the power supply line 12, the clock signal line 17, and the clock signal 27 has an identical predetermined width. Embodiment 2, however, is not limited to this configuration.

The input line 13, the input line 14, the enable signal line 18a, and the enable signal line 18b are formed so as to extend in the horizontal direction, and are disposed in an opposite area of one portion of the power supply line 12 with respect to the clock signal line when viewed from above. The input line 13 is connected to each of a drain electrode of the transistor Ta15 and a drain electrode of the transistor Ta25. The input line 14 is connected to each of a drain electrode of the transistor Tb15 and a drain electrode of the transistor Tb25. The enable signal line 18a is connected to a gate electrode of the transistor Ta15 and a gate electrode of the transistor Tb15. The enable signal line 18b is connected to a gate electrode of the transistor Ta25 and a gate electrode of the transistor Tb25. Note that though in FIG. 4, the input line 13, the input line 14, the enable signal line 18a, and the enable signal line 18b each are illustrated as if each of these lines were formed in two positions, each of these lines is continuous in a section that is not illustrated. The input line 13, the input line 14, the enable signal line 18a, and the enable signal line 18b have an identical predetermined width that is narrower than a width of the power supply line 11 and/or the like. However, Embodiment 2 is not limited to this configuration.

The output line 15a, the output line 16a, the output line 15b, and the output line 16b are formed so as to extend in the horizontal direction and disposed so as to be orthogonal to the other portion of the power supply line 12 when viewed from above. The output line 15a is connected to a source electrode of the transistor Ta12 via a leader line and a contact hole. The output line 16a is connected to a source electrode of the transistor Tb12 via a leader line and a contact hole. The output line 15b is connected to a source electrode of the transistor Ta22 via a leader line and a contact hole. The output line 16b is connected to a source electrode of the transistor Tb22 via a leader line and a contact hole. The output line 15a, the output line 16a, the output line 15b, and the output line 16b each have an identical predetermined width that is narrower than a width of the power supply line 11 or the like. However, Embodiment 2 is not limited to this configuration.

Each of the transistors other than the transistors Ta15, Tb15, Ta25, and Tb25 is laid out in an area between the power supply line 11 and the other portion of the power supply line 12 when viewed from above. Meanwhile, the transistors Ta15, Tb15, Ta25, and Tb25 are laid out in an opposite area of the one portion of the power supply line 12 with respect to the clock signal line 17 when viewed from above.

In the semiconductor device unit 50, in accordance with a timing at which the first enable signal EN1 is turned active, the first output signal OUT1 and the first inversion output signal OUTB1 are sequentially outputted and in accordance with a timing at which the second enable signal EN2 is turned active, the second output signal OUT2 and the second inversion output signal OUTB2 are sequentially outputted. In the semiconductor device 10b of the semiconductor device unit 50, the inversion clock signal CKB is supplied in place of the clock signal CK.

Areas where the capacitors Ca11 and Cb11 are formed are disposed so as to overlap with the clock signal line 17 (control signal line) and the power supply line 11 (metal line) when viewed from above. The clock signal line 17 and the power supply line 11 are provided on a capacitor electrode 24 so that an interlayer insulating film 25 is present between (a) the capacitor electrode 24 and (b) the clock signal line 17 and the power supply line 11. A semiconductor layer 22 is connected to the clock signal line 17 via a contact hole 26. This results in formation of each of the capacitors Ca11 and Cb11 in a section (overlap section) where the semiconductor layer 22, a gate insulating film 23, and the capacitor electrode 24 overlap one another. The areas where the capacitors Ca11 and Cb11 are formed are larger than areas where the capacitors Ca1 and Cb1 of Embodiment 1 are formed.

Areas where the capacitors Ca21 and Cb21 are formed are disposed so as to overlap with the clock signal line 27 (control signal line) and the one portion of the power supply lines 12 (metal line) when viewed from above. The one portion of the power supply line 12 and the clock signal line 27 are present on a capacitor electrode 24 so that an interlayer insulating film 25 is present between (a) the capacitor electrode 24 and (b) the one portion of the power supply line 12 and the clock signal line 27. A semiconductor layer 22 is connected to the clock signal line 27 via a contact hole 26. This results in formation of each of the capacitors Ca21 and Cb21 in a section (overlap section) where the semiconductor layer 22, a gate insulating film 23, and the capacitor electrode 24 overlap one another. The areas where the capacitors Ca21 and Cb21 are formed are larger than areas where the capacitors Ca1 and Cb1 of Embodiment 1 are formed, but have the same size as the areas where the capacitors Ca11 and Cb11 are formed.

In the semiconductor device unit 50 configured as described above, the overlap section that becomes each of the capacitors Ca11 and Cb11 overlaps with the clock signal line 17 and the power supply line 11 when viewed from above. Further, the overlap section that becomes each of the capacitors Ca21 and Cb21 overlaps with the clock signal 27 and the one portion of the power supply line 12. When a power supply VDD is stable, concern about superposition of noise can be eliminated.

Therefore, in the above case, regardless of influence of noise, the areas for forming the capacitors Ca1 and Cb1 can be overlapped with the power supply line 11. This makes it possible to effectively utilize a space. Therefore, efficient utilization of a layout space makes it possible to reduce a layout space that is used only for formation of the capacitors Ca11, Cb11, Ca21 and Cb21. Therefore, in the semiconductor device unit 50, reduction in layout area becomes possible.

Further, in the semiconductor device unit 50, while an increase in layout space is suppressed, a wide area for formation of each capacitor can be ensured. This consequently makes it possible to obtain a sufficient potential increase (bootstrap amount). Note that the layout pattern of Embodiment 2 can be applied to a layout pattern of the semiconductor device 10 of Embodiment 1 in a similar manner.

Note that though the semiconductor device unit 50 is configured to include the semiconductor device 10a and the semiconductor device 10b, three or more semiconductor devices may be provided. In such a case, for reducing a layout space, it is desirable to share a power supply line, a signal line, and the like.

Further, depending on a circuit configuration of a semiconductor device, the number of elements may become larger and accordingly a plurality of signal lines may become necessary. In such a case, a layout of these elements and the plurality of signal lines may become complicated inevitably. Though the area where each capacitor is formed is overlapped with two lines of SM in the above description, the overlap section may be overlapped with three or more lines of SM in a layout in which three or more lines of SM are successively disposed. Note, however, that the area is not necessarily overlapped with all of the three or more lines of SM but can be overlapped with any of the three or more lines of SM depending on a desired capacitance. In this way, efficient utilization of a layout space becomes possible.

EMBODIMENT 3

The following discusses one embodiment of the present invention with reference to drawings. Embodiment 3 deals with a liquid crystal display device including a liquid crystal panel to which a semiconductor device 10 or a semiconductor device unit of the above embodiments is mounted. Note that configurations other than configurations explained in Embodiment 3 are the same as those in Embodiments 1 and 2. Further, for convenience of explanation, members having identical functions as those illustrated in drawings of Embodiments 1 and 2 are given the same reference signs and explanations thereof are omitted.

Figure 5:
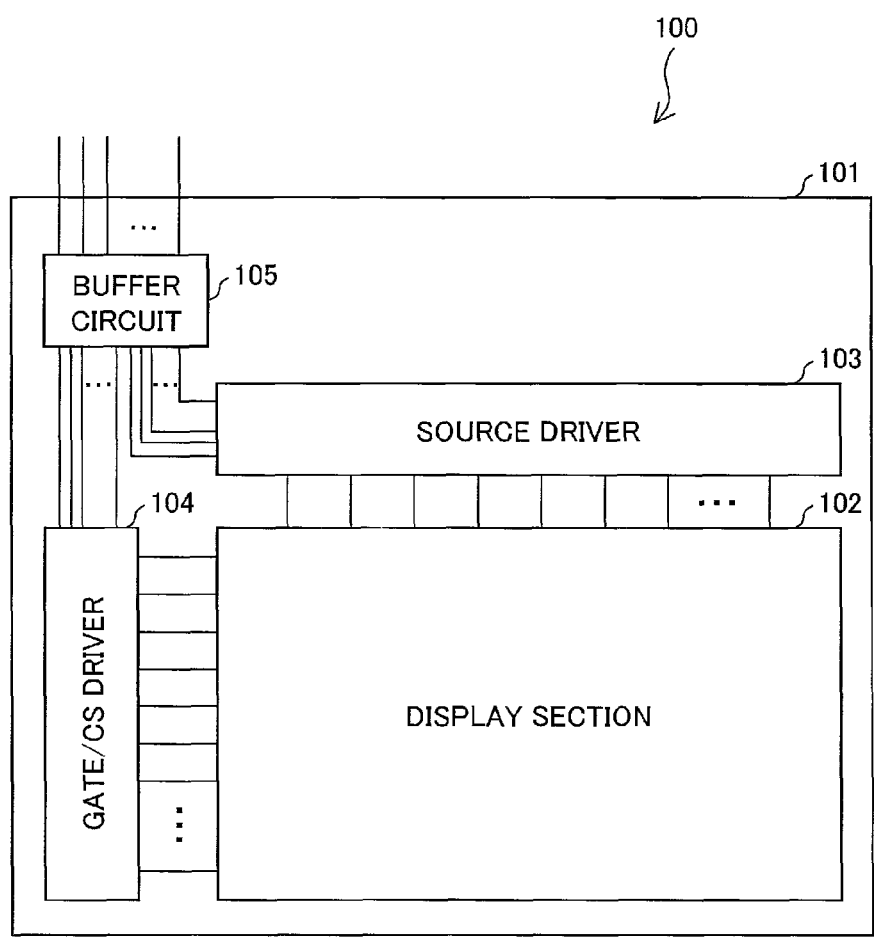
FIG. 5 is a block diagram illustrating one embodiment of a liquid crystal display device of the present invention.

FIG. 5 is a block diagram schematically illustrating one example configuration of a liquid crystal display device 100 of Embodiment 3. As illustrated in FIG. 5, the liquid crystal display device 100 includes a liquid crystal panel 101, and the display panel 101 includes a display section 102, a source driver 103 (driver circuit), a gate/CS driver 104 (driver circuit) and a buffer circuit 105.

The display section 102 is provided with pixels arranged in the form of an array. Further, the display section 102 is provided with source lines, gate lines, and CS lines so that these lines correspond to the pixels. The source driver 103 sequentially outputs, to the source lines of the display section 102, data signals to be written into the pixels. The gate/CS driver 104 sequentially outputs, to the gate lines of the display section 102, selection signals (scanning signals) each for selecting a pixel into which a data signal from the source driver 103 is to be written, and also outputs CS signals to the CS lines that are lines each for supplying a potential to an auxiliary capacitor (CS capacitor). The buffer circuit 105 supplies, to the source driver 103 and the gate/CS driver 104, various control signals (e.g., clock signal CK, start pulse SP, initialization signal INI, and polarity determination signal) in the form of low-output impedance signals, which various control signals each are sent from an external display controller or the like.

In the liquid crystal display device 100, it is possible to apply the semiconductor device 10 of Embodiment 1 or the semiconductor device unit 50 of embodiment 2 to each section of the liquid crystal display device 100. For example, the semiconductor device 10 of Embodiment 1 or the semiconductor device unit 50 of embodiment 2 can be suitably applied to a shift register, an output section, and/or the like in the source driver 103 and the gate/CS driver 104. As such a shift register and/or an output section, a semiconductor device including a transistor and a bootstrap capacitor is widely employed. In particular, the shift register is configured by a circuit including a CMOS transistor(s), a bootstrap capacitor(s), and the like, or a circuit including transistors of one conductivity type, a bootstrap capacitor(s), and the like.

Therefore, the effect provided by the semiconductor device 10 of Embodiment 1 or the semiconductor device unit 50 of Embodiment 2 can be obtained in each section in the liquid crystal display device 100, and the liquid crystal device 100 as a whole can achieve a narrower frame, a smaller size, and a smaller weight.

Further, though not illustrated, the liquid crystal panel 101 has a configuration in which two substrates facing each other sandwich a liquid crystal layer. One of the two substrates is a substrate on which a common electrode and the like is formed, while the other one of the two substrates is a substrate (active matrix substrate) on which the display section 102 and the like is formed. Moreover, peripheral circuits such as the source driver 103, the gate/CS driver 104, and the buffer circuit 105 may be monolithically formed on the active matrix substrate. In particular, the liquid crystal panel 101 having such an active matrix substrate can achieve reduction in layout area. This makes it possible achieve a more narrower frame, a more smaller size, and a more smaller weight.

Note that the configuration of the liquid crystal display device 100 is schematically described above, and the liquid crystal display device 100 may have other conventional common configuration. For example, the liquid crystal display device 100 can include a backlight, a display controller and the like. The liquid crystal display device 100 can also include a power supply for a logic circuit and/or a power supply circuit that is for generating a reference voltage of a data signal, a common voltage, an auxiliary capacitor voltage, or the like. In addition, the source driver 103 may be replaced by a demultiplexer.

The present invention is not limited to the description of the embodiments above, but may be altered by a skilled person within the scope of the claims. An embodiment based on a proper combination of technical means disclosed in different embodiments is encompassed in the technical scope of the present invention.

A semiconductor device of the present invention including at least a transistor and a bootstrap capacitor, the semiconductor device is configured to include: a first electrode made of a material that is the same as a material of a channel layer of the transistor; a second electrode formed in an upper layer of the first electrode; a control signal line formed in an upper layer of the second electrode; a first insulating film provided between the first electrode and the second electrode; and a second insulating film provided between the second electrode and the control signal line, the second electrode being connected to a gate electrode of the transistor, the control signal line being supplied with a control signal from outside the semiconductor device, the bootstrap capacitor being formed in an overlap section where the first electrode, the first insulating film and the second electrode overlap one another, the overlap section and the control signal line overlapping each other when viewed from above.

In the semiconductor device of the present invention, preferably, the control signal is a clock signal.

In the semiconductor device of the present invention, preferably, the control signal line is connected to the first electrode via a contact hole.

The semiconductor device of the present invention can be configured to include: a plurality of bootstrap capacitors obtained by plurally providing the bootstrap capacitor, wherein the control signal line is overlapped with an overlap section where each of the plurality of bootstrap capacitors is formed.

Preferably, the semiconductor device of the present invention further includes: a metal line formed in a layer where the control signal line is formed, so as to be adjacent to the control signal line, wherein the overlap section overlaps with the control signal line and the metal line when viewed from above. This makes it possible to ensure a wide area for the overlap section by efficiently utilizing a layout space.

The semiconductor device of the present invention can be configured to include: a plurality of bootstrap capacitors obtained by plurally providing the bootstrap capacitor, wherein the control signal line and the metal line overlap with an overlap section where each of the plurality of bootstrap capacitors is formed.

In the semiconductor device of the present invention, preferably, the metal line is plurally provided.

INDUSTRIAL APPLICABILITY

The present invention can be suitably applied not only to a filed related to a semiconductor device including at least a transistor and a bootstrap capacitor, but also to a field related to a method for producing the semiconductor device. Further, the present invention can also be widely applied, for example, to a field of a liquid crystal panel including the semiconductor device, and a liquid crystal display device including such a liquid crystal panel.

REFERENCE SIGNS LIST 10, 10a, 10b semiconductor device
11 power supply line (metal line)
12 power supply line (metal line)
17 clock signal line (control signal line)
21 substrate
22 semiconductor layer (first electrode)
23 gate insulating film (first insulating film)
24 capacitor electrode (second electrode)
25 interlayer insulating film (second insulating film)
26 contact hole
27 clock signal line (control signal line)
50 semiconductor device unit
100 liquid crystal display device
101 liquid crystal panel
102 display section
103 source driver (driver circuit)
104 gate/CS driver (driver circuit)
Ca1, Ca11, Ca21, Cb1, Cb11, Cb21 capacitor

The invention claimed is:

1. A semiconductor device unit including at least a plurality of transistors, a first bootstrap capacitor, and a second bootstrap capacitor, the semiconductor device unit comprising:
a first semiconductor device and a second semiconductor device which are aligned along a vertical direction; and
a first control signal line, a second control signal line, a first power supply line, and a second power supply line each extending in the vertical direction; wherein
the first semiconductor device includes:
a first electrode made of a material that is the same as a material of a channel layer of each of the plurality of transistors;
a second electrode formed in an upper layer of the first electrode; and
a first insulating film provided between the first electrode and the second electrode;
the second semiconductor device includes:
a third electrode made of a material that is the same as the material of the channel layer of each of the plurality of transistors;
a fourth electrode formed in an upper layer of the third electrode; and
a second insulating film provided between the third electrode and the fourth electrode;
the second electrode and the fourth electrode are each connected to a gate electrode of corresponding ones of the plurality of transistors;
the first control signal line and the second control signal line are each supplied with a control signal from outside the semiconductor device unit;
the first bootstrap capacitor is formed in a first overlap section where the first electrode, the first insulating film and the second electrode overlap one another;
the second bootstrap capacitor is formed in a second overlap section where the third electrode, the second insulating film, and the fourth electrode overlap one another;
the first control signal line is formed in an upper layer of the second electrode;
a third insulating film is provided between the first control signal line and the second electrode;
the second control signal line is formed in an upper layer of the fourth electrode;
a fourth insulating film is provided between the second control signal line and the fourth electrode; and
the first overlap section covers the first power supply line and the first control signal line in a bottom view, and the second overlap section covers the second power supply line and the second control signal line in the bottom view.

2. The semiconductor device unit as set forth in claim 1, wherein the first control signal line is connected to the first electrode via a contact hole.

3. The semiconductor device unit as set forth in claim 1, further comprising:
a metal line formed in a layer where the first control signal line is formed, so as to be adjacent to the first control signal line,
wherein the first overlap section overlaps with the first control signal line and the metal line when viewed from above.

4. The semiconductor device unit as set forth in claim 3 comprising:
a plurality of first bootstrap capacitors obtained by plurally providing the first bootstrap capacitor,
wherein the first control signal line and the metal line overlap with the first overlap section where each of the plurality of first bootstrap capacitors is formed.

5. The semiconductor device unit as set forth in claim 3, wherein the metal line is plurally provided.

6. The semiconductor device unit as set forth in claim 1, wherein
the first semiconductor device and the second semiconductor device share the first control signal line and the second control signal line.

7. An active matrix substrate comprising a display section and a driver circuit which is monolithically formed on the active matrix substrate, the driver circuit including the semiconductor device unit as set forth in claim 1.

8. A liquid crystal panel comprising the active matrix substrate as set forth in claim 7.

9. A liquid crystal display device comprising the liquid crystal panel as set forth in claim 8.

10. The semiconductor device unit as set forth in claim 1, wherein the second power supply line, the second control signal line, the first control signal line, and the first power supply line are aligned in this order in a horizontal direction.

* * * * *